(12) United States Patent
Hara et al.

(10) Patent No.: US 7,755,434 B2
(45) Date of Patent: Jul. 13, 2010

(54) ELECTRONIC CIRCUIT

(75) Inventors: Hiroshi Hara, Yamanashi (JP); Sosaku Sawada, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 12 days.

(21) Appl. No.: 12/167,579

(22) Filed: Jul. 3, 2008

(65) Prior Publication Data

US 2009/0009246 A1 Jan. 8, 2009

(30) Foreign Application Priority Data

Jul. 5, 2007 (JP) ............................. 2007-177176

(51) Int. Cl.
*H03F 3/08* (2006.01)
(52) U.S. Cl. .................. 330/308; 250/214 A
(58) Field of Classification Search ................ 330/254, 330/308; 398/210, 202; 250/214 A
See application file for complete search history.

(56) References Cited

U.S. PATENT DOCUMENTS

| 5,512,874 | A | * | 4/1996 | Poston ................... 340/426.26 |
| 6,658,217 | B2 | * | 12/2003 | Ohhata et al. ............... 398/202 |
| 6,760,552 | B1 | * | 7/2004 | Tajima et al. ............... 398/210 |
| 7,557,333 | B2 | * | 7/2009 | Takahashi et al. ........ 250/214 R |
| 2008/0310861 | A1 | * | 12/2008 | Wong et al. ................. 398/210 |

FOREIGN PATENT DOCUMENTS

JP       2005-223638 A       8/2005

* cited by examiner

*Primary Examiner*—Robert Pascal
*Assistant Examiner*—Hieu P Nguyen
(74) *Attorney, Agent, or Firm*—Westerman, Hattori, Daniels & Adrian, LLP

(57) ABSTRACT

An electronic circuit includes a differential amplifier circuit, a first smoothing circuit, a second smoothing circuit and a first switch. The differential amplifier circuit receives a digital input signal and a reference signal. The first smoothing circuit smoothes the digital input signal with a first capacitance value. The second smoothing circuit smoothes the digital input signal with a second capacitance value larger than the first capacitance value. The first switch selects one of output signals from the first smoothing circuit and the second smoothing circuit as the reference signal.

10 Claims, 18 Drawing Sheets

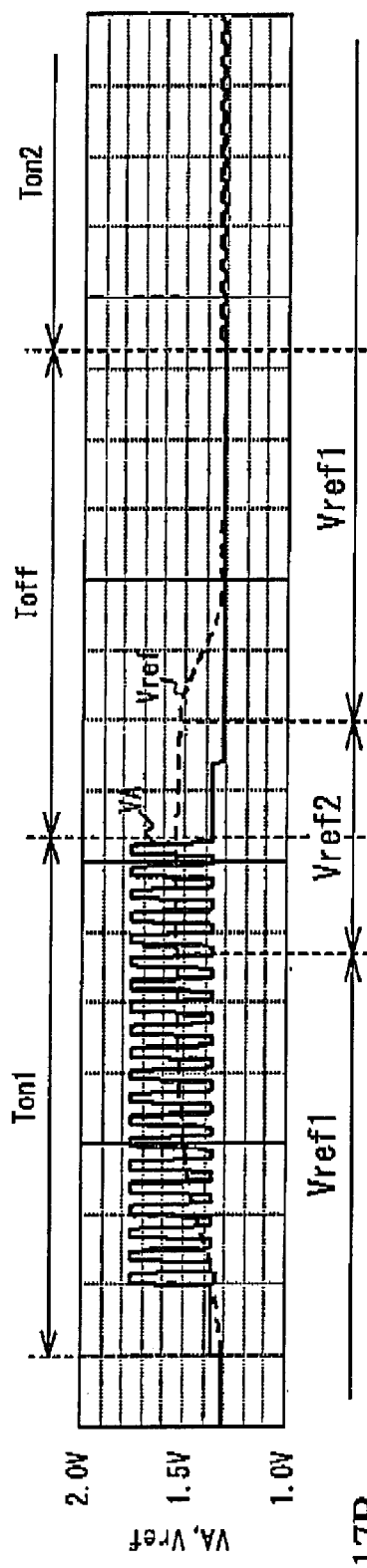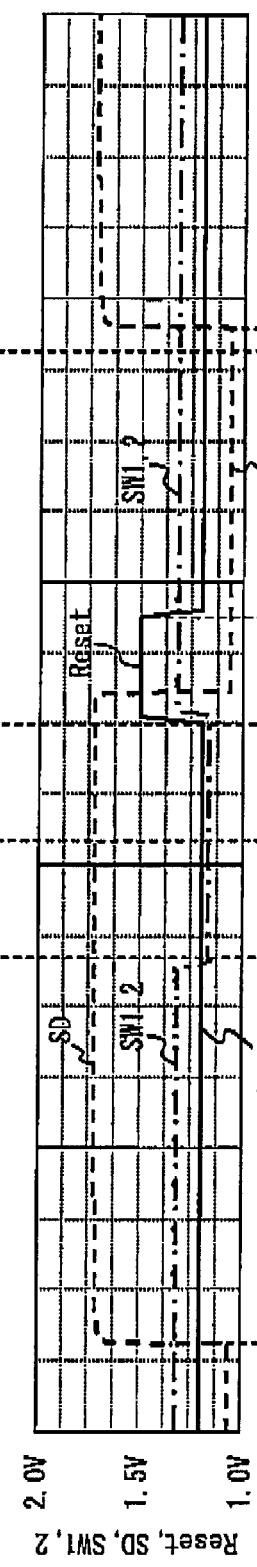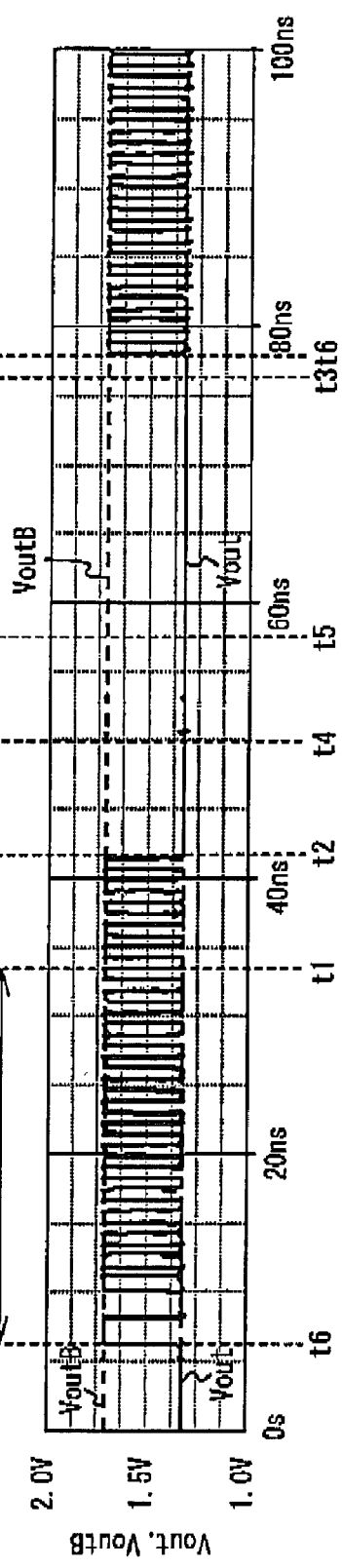
FIG. 17A
FIG. 17B
FIG. 17C

ELECTRONIC CIRCUIT

BACKGROUND OF THE INVENTION

1. Field of the Invention

The present invention relates to an electronic circuit, and in particular, relates to an electronic circuit having a differential amplifier circuit receiving an input signal and a reference signal and generating a reference signal by smoothing the input signal.

2. Description of the Related Art

Recently, a PON (Passive Optical Network) type FTTH (Fiber to the home) is widely spread. There is a demand for receiving a variable amplitude optical signal from each home and amplifying the optical signal as electrical signal, with respect to the system.

FIG. 1 illustrates a block diagram showing an electronic circuit 100 that is a receiving circuit used for a PON type optical communication disclosed in Japanese Patent Application Publication No. 2005-223638. A light-receiving element such as a PD (photo diode) 10 receives an optical signal and outputs an electrical current. A trans-impedance amplifier (TIA) 12 converts the electrical signal from the PD 10 into a voltage signal. The electronic circuit 100 has differential amplifier circuits 14 and 16 and a reference signal generation circuit 18. The differential amplifier circuit 14 differentially amplifies an input signal VA and a reference signal Vref, the input signal VA being an input signal of the differential amplifier circuit 14 and fed into the electronic circuit 100, the reference signal Vref being generated by the reference signal generation circuit 18 from the input signal VA. The differential amplifier circuit 16 amplifies and saturates the output of the differential amplifier circuit 14, and outputs differential output signals Vout and VoutB. The differential amplifier circuit 16 outputs a high level as the output signal Vout and outputs a low level as the output signal VoutB when the input signal VA is higher than the reference signal Vref. The differential amplifier circuit 16 outputs a low level as the output signal Vout and outputs a high level as the output signal VoutB when the input signal VA is lower than the reference signal Vref. The receiving circuit used for the PON type optical communication selects a signal related to an average of input signals as a reference signal, compares the reference signal and the input signals, and outputs a high level and a low level, because amplitude of an optical signal is not constant.

SUMMARY OF THE INVENTION

The present invention has been made in view of the above circumstances and provides an electronic circuit that stabilizes a reference signal promptly and stabilizes the reference signal even if a high level or a low level is fed into continuously.

According to an aspect of the present invention, there is provided an electronic circuit including: a differential amplifier circuit receiving a digital input signal and a reference signal; a first smoothing circuit that smoothes the digital input signal with a first capacitance value; a second smoothing circuit that smoothes the digital input signal with a second capacitance value larger than the first capacitance value; and a first switch that selects one of output signals from the first smoothing circuit and the second smoothing circuit as the reference signal.

With the structure, a differential between time constants of the first smoothing circuit and second smoothing circuit is enlarged. It is therefore possible to stabilize a reference signal promptly and to stabilize the reference signal even if a high level or a low level is fed into continuously.

BRIEF DESCRIPTION OF THE DRAWINGS

Other objects, features and advantages of the present invention will become more apparent from the following detailed description when read in conjunction with the accompanying drawings, in which:

FIG. 17A through FIG. 17C illustrate a simulation result of each signal of the electronic circuit in accordance with the fourth embodiment.

DESCRIPTION OF THE PREFERRED EMBODIMENTS

A description will now be given of embodiments of the present invention with reference to the accompanying drawings.

Figure 1:
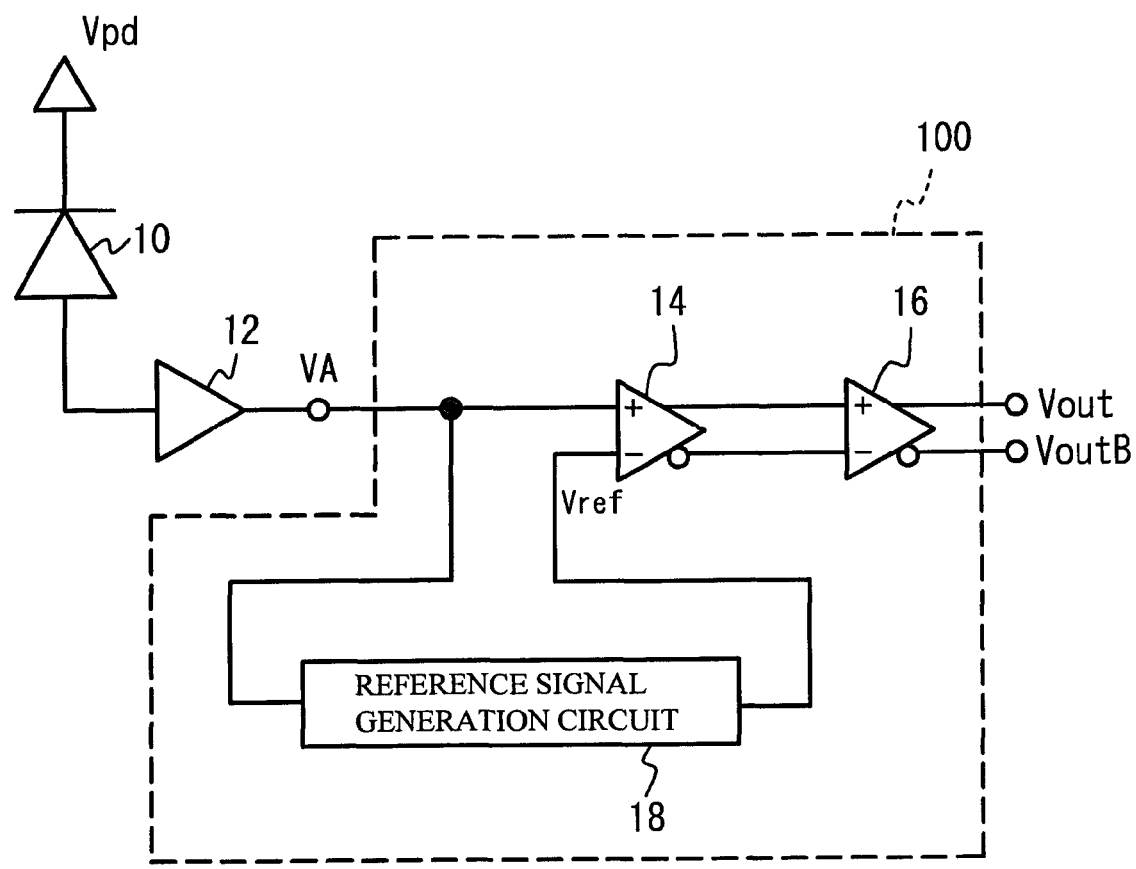
FIG. 1 illustrates a circuit diagram of an electronic circuit in accordance with a conventional embodiment.
Figure 2A:
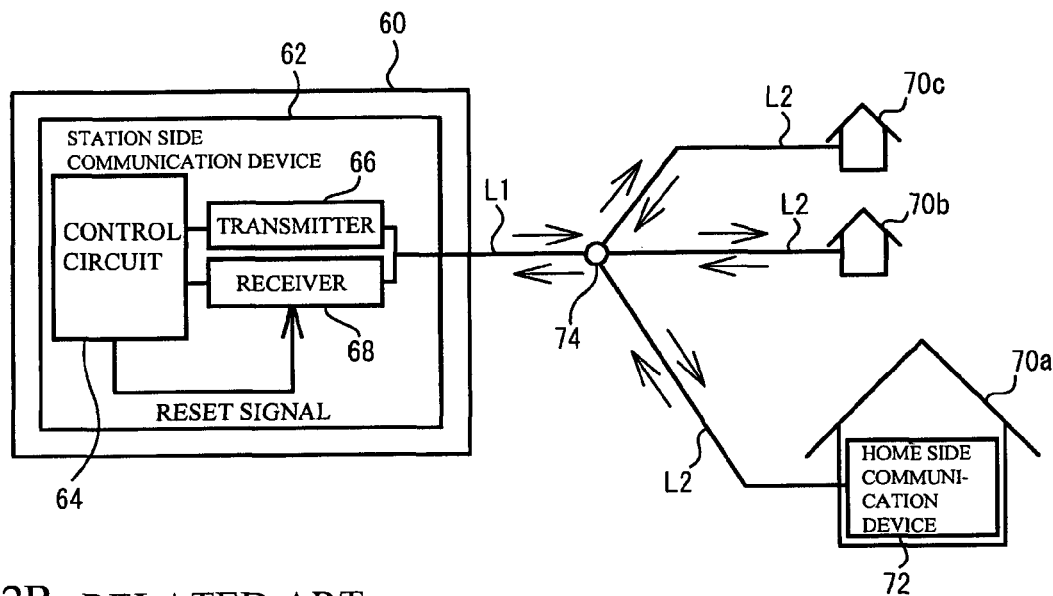
FIG. 2A illustrates a block diagram of a PON type.

A description will be given of a PON type communication system. FIG. 2A illustrates a block diagram of the PON type communication system. A station-side communication device 62 in a station 60 is connected to a home-side communication device 72 in homes 70a through 70c via communication pathways L1 and L2 made of an optical fiber. The station-side communication device 62 is connected to an optical splitter 74 via a single communication pathway L1. The optical splitter 74 is connected to each of the home-side communication devices 72 via each of the communication pathways L2. The optical splitter 74 transmits signals to the communication pathway L1, the signals being input to or output from each home-side communication device 72 via the second communication pathway L2. The signal in the communication pathway L1 is input to or output from the station-side communication device 62. The station-side communication device 62 has a control circuit 64, a transmitter 66 and a receiver 68. The transmitter 66 is a transmitting circuit for transmitting an optical signal to each of the home-side communication device 72. The receiver 68 is a receiving circuit for receiving an optical signal from each of the home-side communication device 72. For example, the receiver 68 has the electronic circuit 100 shown in FIG. 1. The control circuit 64 is a circuit for controlling the transmitter 66 and the receiver 68. For example, the control circuit 64 outputs a reset signal to the receiver 68.

Figure 2B:
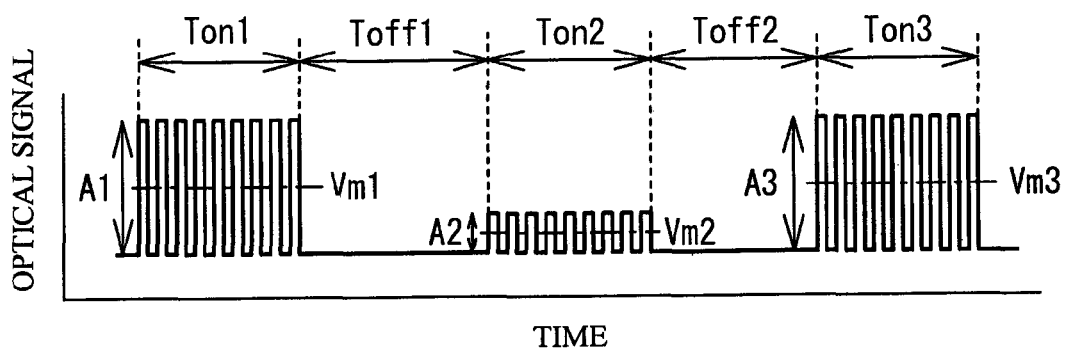
FIG. 2B illustrates a schematic view of an optical signal with respect to time of a PON type optical communication.

FIG. 2B illustrates a schematic view of an optical signal fed into the PD 10 (shown in FIG. 1) of the receiver 68 with respect to time. The receiver 68 receives an optical signal from the home-side communication device 72 of the home 70a for a period Ton1. The receiver 68 does not receive an optical signal for a period Toff1 and receives an optical signal from the home-side communication device (not shown) of the home 70b for a period Ton2. The receiver 68 does not receive an optical signal for a period Toff2 and receives an optical signal from the home-side communication device (not shown) of the home 70c for a period Ton3. Amplitude of optical signals from the home-side communication devices 72 differs from each other. Loss of optical signals in the communication pathways L2 differs from each other. Therefore, the amplitude of the optical signal of the periods Ton1, Ton2 and Ton3 respectively differs from amplitude A1, A2 and A3. Thus, the PD 10 of the PON type receives optical signals having different amplitude from different homes at random times. The periods Toff1 and Toff2 are a period for switching the communication pathway L2.

Figure 3:
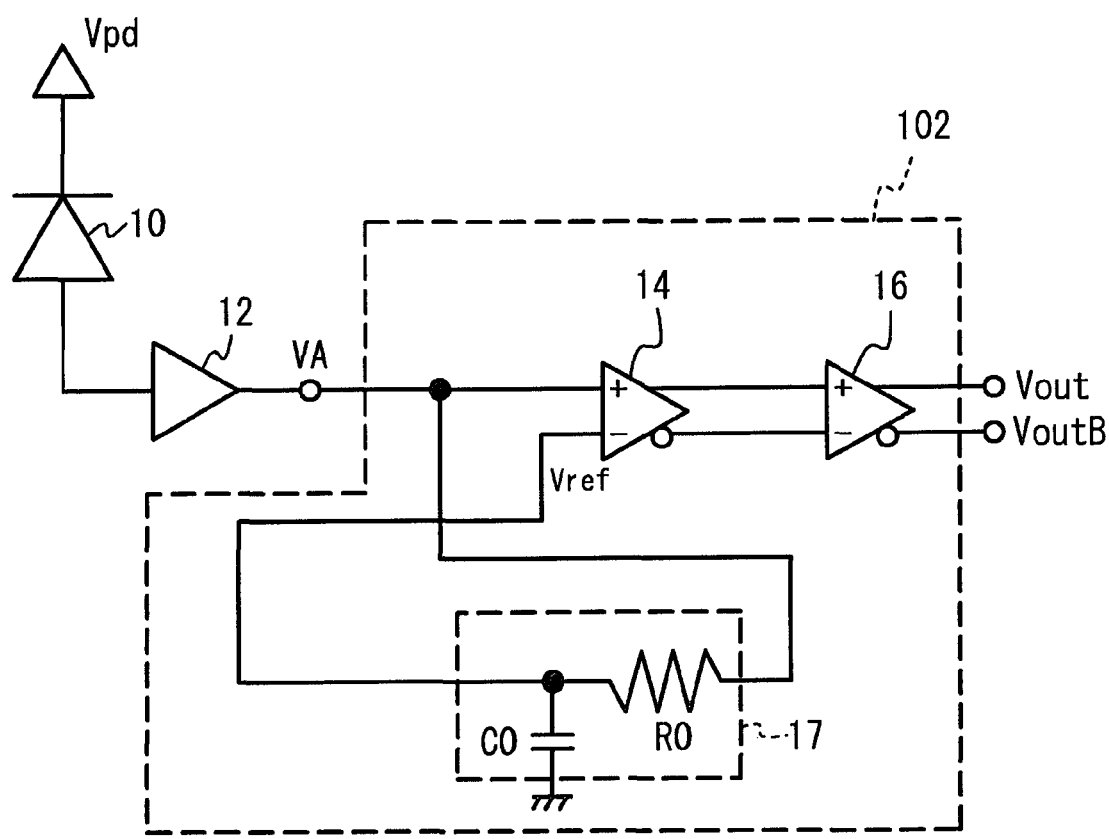
FIG. 3 illustrates a circuit diagram of an electronic circuit in accordance with a first comparative embodiment.

Next, a description will be given of a first comparative embodiment. As shown in FIG. 3, an electronic circuit 102 in accordance with the first comparative embodiment has a smoothing circuit 17 including a resistor R0 and a capacitor C0. The smoothing circuit 17 smoothes an input signal VA and outputs the smoothed signal to the differential amplifier circuit 14 as a reference signal. The other structures are the same as that of FIG. 1. The smoothing circuit 17 corresponds to the reference signal generation circuit 18 shown in FIG. 1.

Figure 4A:
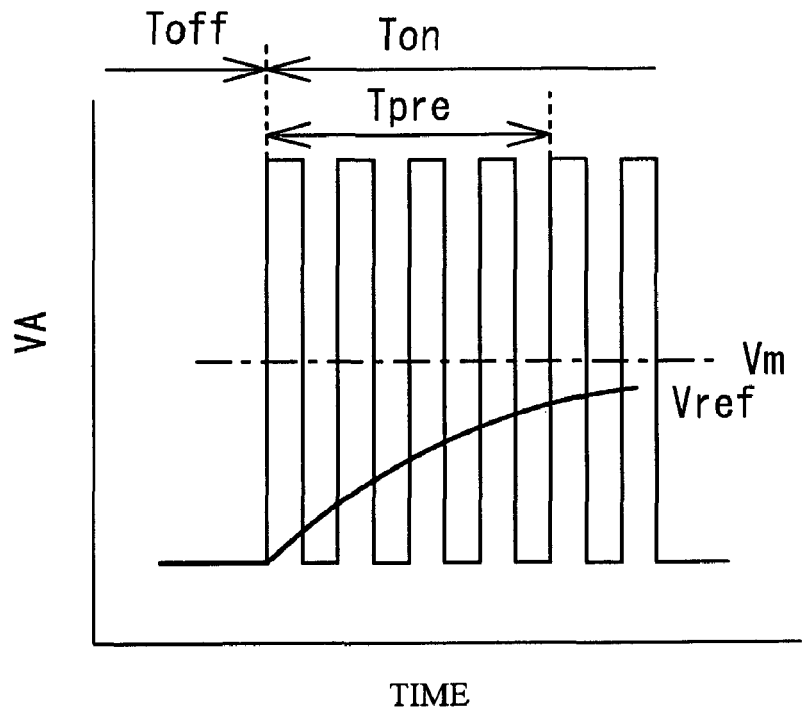
FIG. 4A illustrates a timing chart in a case where a time constant of an electronic circuit in accordance with the first comparative embodiment is large.
Figure 4B:
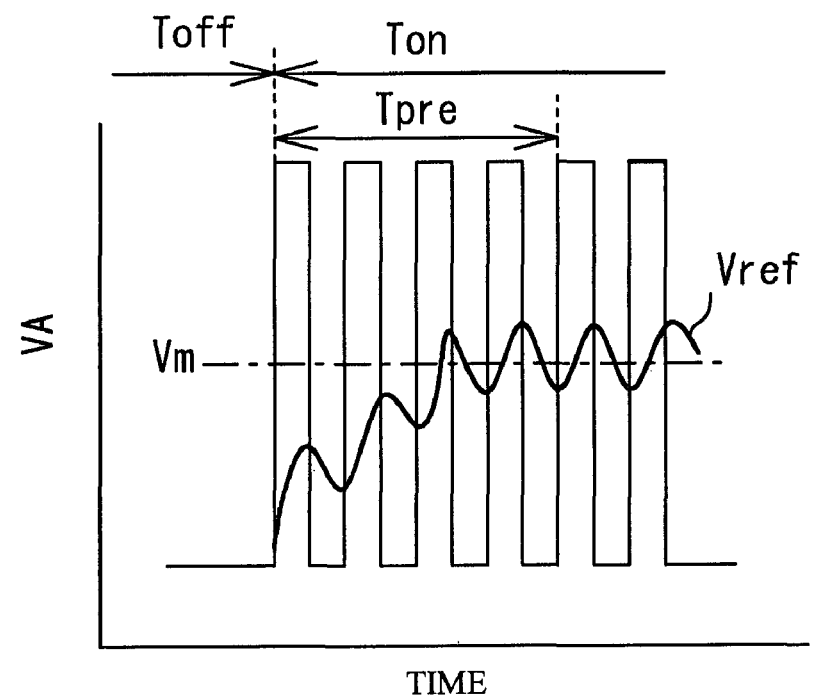
FIG. 4B illustrates a timing chart in a case where the time constant of the electronic circuit in accordance with the first comparative embodiment is small.

FIG. 4A and FIG. 4B illustrate the input signal VA and the reference signal Vref with respect to time of the electronic circuit 102 in accordance with the first comparative embodiment. As shown in FIG. 4A and FIG. 4B, the PD 10 does not receive optical signal for the period Toff. Therefore, the input signal VA is an initial signal. The PD 10 receives an optical signal in the period Ton. Thus, the input signal VA changes. An on-signal ("1" signal) and an off-signal ("0" signal) are fed into the PD 10 alternately for a given period (a preamble period Tpre). The differential amplifier circuit 14 and the differential amplifier circuit 16 output a high level as an output signal Vout when the input signal VA is higher than the reference signal Vref, and outputs a low level as an output signal VoutB when the input signal VA is lower than the reference signal Vref. It is therefore preferable that the reference signal Vref is changed to an average Vm of the input signal VA promptly. However, the reference signal Vref is not changed to the average Vm promptly when a time constant of the smoothing circuit 17 is slow, as shown in FIG. 4A. The reference signal Vref is not stabilized for the preamble period Tpre. On the other hand, the reference signal Vref is changed to the average Vm promptly in the preamble period Tpre when the time constant of the smoothing circuit 17 is fast, as shown in FIG. 4B. However, after that, the reference signal Vref is changed in synchronism with the changing of the input signal VA.

As mentioned above, it is difficult to change the reference signal Vref to a signal related with the average Vm promptly, in the first comparative embodiment. It is therefore not possible to shorten the preamble period Tpre of an optical signal. This results in a barrier against speed-up of the communication.

Figure 5:
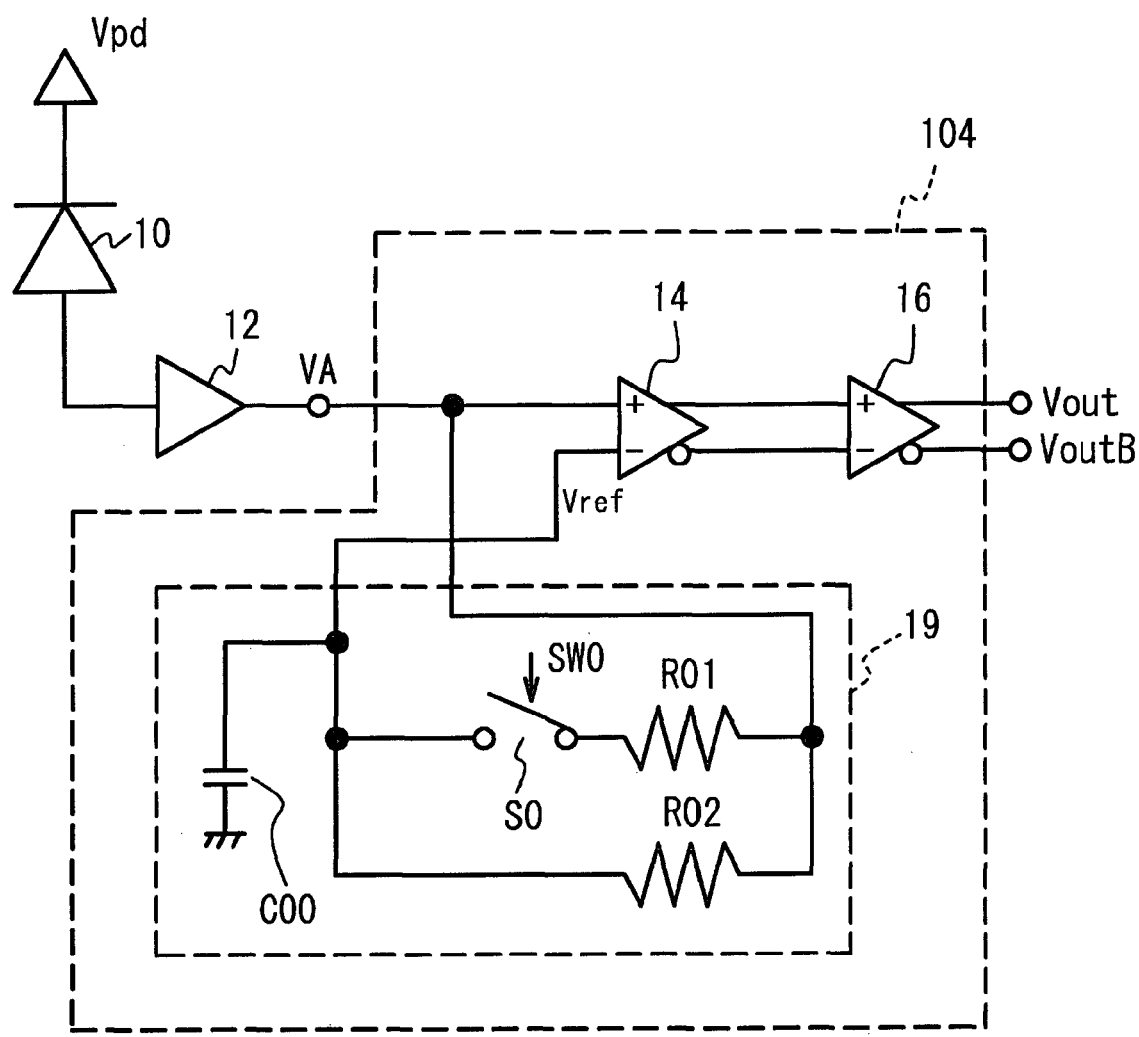
FIG. 5 illustrates a circuit diagram of an electronic circuit in accordance with a second comparative embodiment.

A description will be given of a second comparative embodiment for solving the above-mentioned problem. As shown in FIG. 5, a smoothing circuit 19 has a switch S0, a capacitor C00, a resistor R01 and a resistor R02. The resistors R01 and R02 are connected to the capacitor in parallel, when the switch S0 turns on. On the other hand, the resistor R02 is connected to the capacitor C00 when the switch S0 turns off. Therefore, the smoothing circuit 19 smoothes an input signal with a fast time constant, and outputs the input signal as the reference signal Vref, when the switch S0 turns on. The smoothing circuit 19 smoothes the input signal with a slow time constant, and outputs the input signal as the reference signal Vref. It is preferable that the resistance value of the resistor R01 is larger than that of the resistor R02, in order to enlarge a difference between the time constants in a case where the switch S0 turns on and off.

Figure 6A:
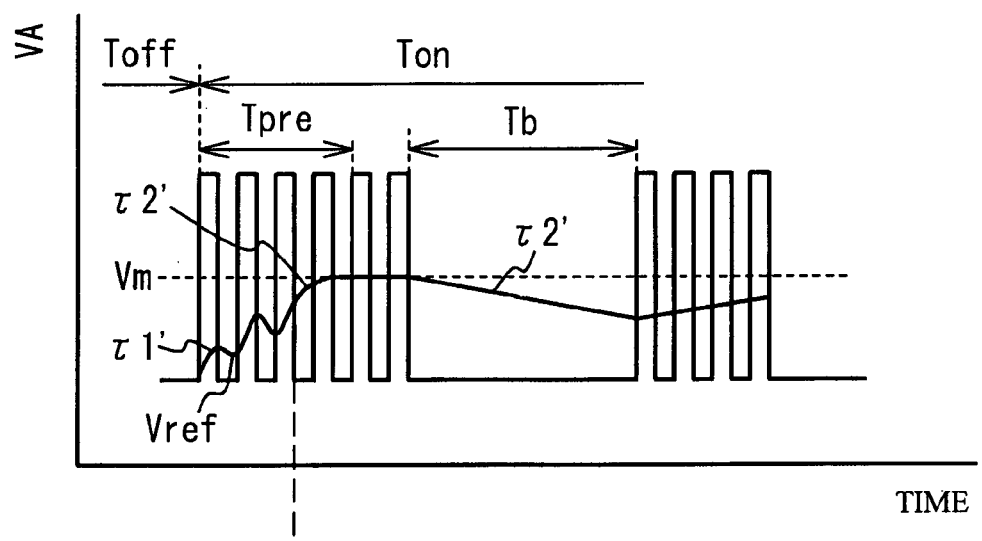
FIG. 6A and FIG. 6B illustrate a timing chart of the electronic circuit in accordance with the second comparative embodiment.
Figure 6B:
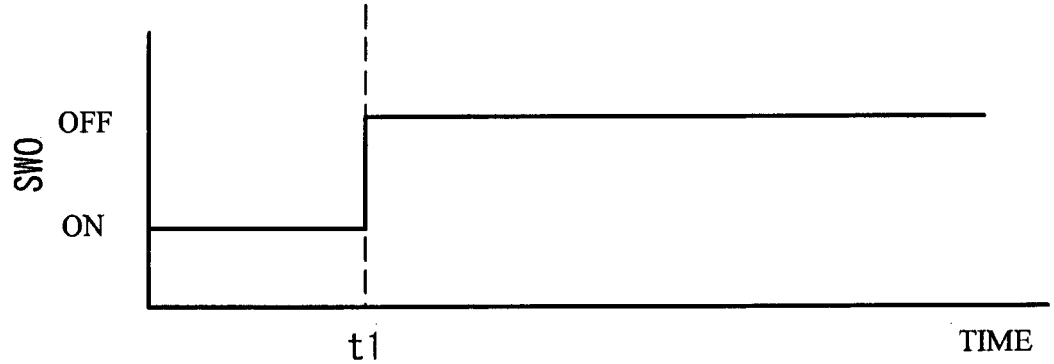

FIG. 6A illustrates the input signal VA and the reference signal Vref with respect to time of an electronic circuit 104 in accordance with the second comparative embodiment. FIG. 6B illustrates a switch signal SW0 for switching the switch S0. The switch signal SW0 is an on-signal and the switch S0 is turned on at beginning of the preamble period Tpre. Therefore, the smoothing circuit 19 smoothes the input signal VA into the reference signal Vref with use of a fast time constant $\tau 1'$. Therefore, the reference signal Vref gets closer to the average Vm promptly. The switch signal SW0 is changed to an off-signal at a time t1, and the switch S0 turns off. Therefore, the smoothing circuit 19 smoothes the input signal into the reference signal Vref with use of a slow time constant $\tau 2'$. It is therefore possible to restrain the changing of the reference signal Vref in synchronism with to the changing of the input signal VA, even if the input signal VA changes.

However, the capacitor C00 is used when the input signal VA is smoothed with use of the time constant $\tau 1'$ and $\tau 2'$, in the second comparative embodiment. In a case of stabilizing the reference signal Vref, it is difficult to reduce a capacitance of the capacitor C00 to a large extent. It is therefore difficult to stabilize the reference signal promptly. There is a demand for securing a clock extraction period in the preamble period, with respect to a clock extraction system using the output signal Vout. In this case, there is a demand for stabilizing the reference signal Vref further promptly. The second comparative may not satisfy the demand mentioned above.

On the other hand, it is not possible to enlarge the capacitance of the capacitor C00 to a large extent, in a view of the time constant $\tau 1'$. It is therefore not possible to reduce the time constant $\tau 2'$ to a large extent. Therefore, the reference signal Vref is reduced with the time constant $\tau 2'$, when the low level continues with respect to the input signal VA as in the case of a period Tb as shown in FIG. 6A. The reference signal Vref gets unstable. A description will be given of following embodiments for solving the above-mentioned problem.

First Embodiment

Figure 7:
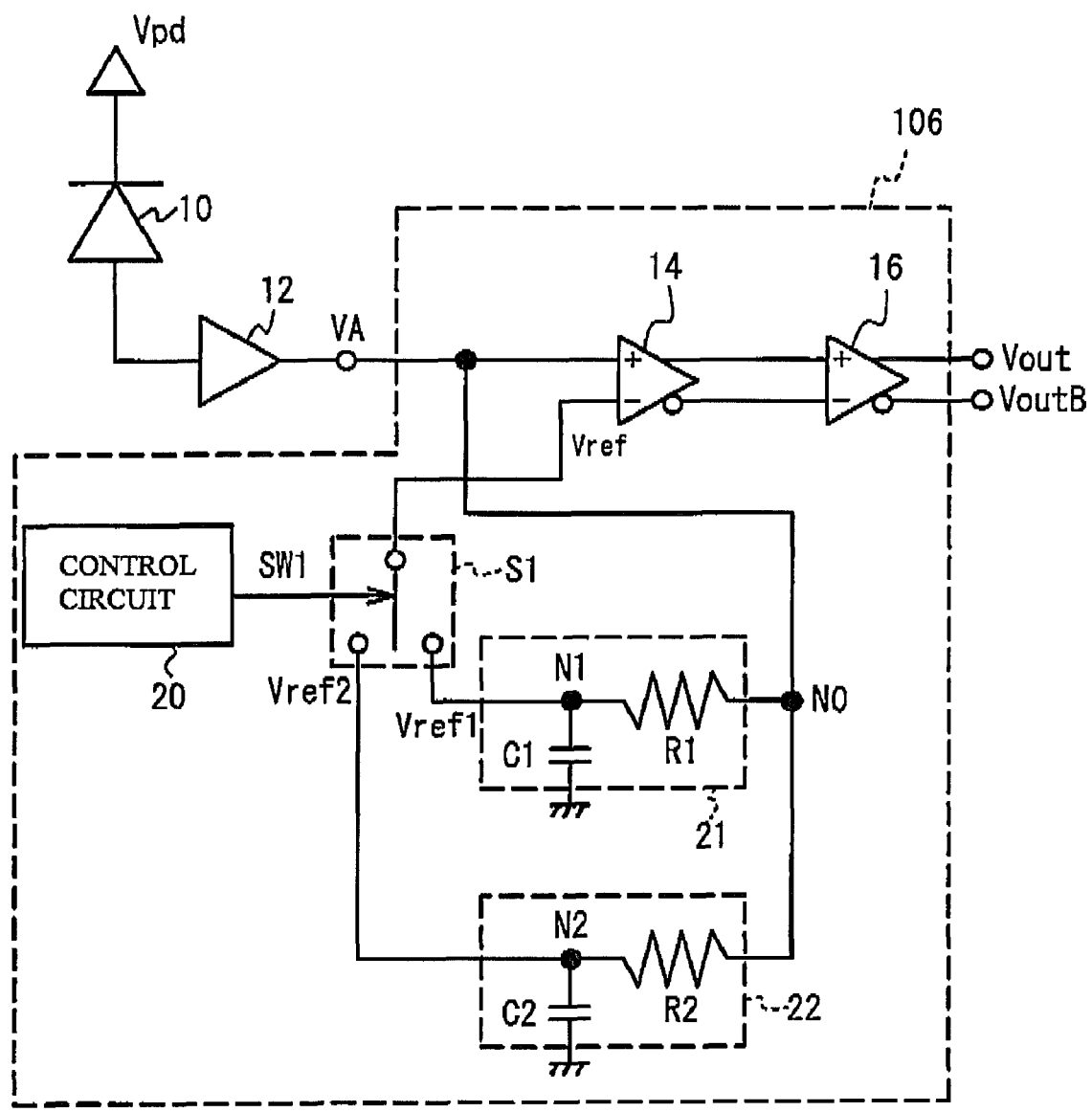
FIG. 7 illustrates a circuit diagram of an electronic circuit in accordance with a first embodiment.

FIG. 7 illustrates a block diagram of an electronic circuit 106 in accordance with a first embodiment. The electronic circuit 106 has differential amplifier circuits 14 and 16, a first smoothing circuit 21, a second smoothing circuit 22, a first switch S1 and a control circuit 20. The differential amplifier circuit 14 receives the digital input signal VA and the reference signal Vref, and differentially amplifies the signals. The differential amplifier circuit 16 amplifies the output from the differential amplifier circuit 14 saturatedly, and outputs the output signal Vout and the output signal VoutB. The first smoothing circuit 21 and the second smoothing circuit 22 are connected in parallel.

The first smoothing circuit 21 has a resistor R1 between an input node N0 into which the input signal VA is fed and an output node N1 of the first smoothing circuit 21 in series. A capacitor C1 is connected between the output node N1 and the ground. Therefore, the first smoothing circuit 21 smoothes the input signal VA with use of a first time constant $\tau 1$ that is defined with the resistor R1 and the capacitor C1. The second smoothing circuit 22 has a resistor R2 between the input node N0 and an output node N2 of the second smoothing circuit 22 in series. A capacitor C2 is connected between the output node N2 and the ground. Therefore, the second smoothing circuit 22 smoothes the input signal VA with use of a time constant $\tau 2$ that is defined with the resistor R2 and the capacitor C2. The second time constant $\tau 2$ gets larger than the first time constant $\tau 1$, when the resistance value of the resistor R2 (a second resistance value) is larger than that of the resistor R1 (a first resistance value) and a capacitance value of the capacitor C2 (a second capacitance value) is larger than that of the capacitor C1 (a first capacitance value). The first switch S1 selects one of the outputs of the first smoothing circuit 21 and the second smoothing circuit 22. The selected output is the reference signal Vref. The control circuit 20 outputs a first switch signal SW1 to the first switch S1, the first switch signal SW1 switching the reference signal Vref from the first output signal Vref1 of the first smoothing circuit 21 to the second reference signal Vref2 of the second smoothing circuit 22.

In the second comparative embodiment, the capacitance values are equal to each other and the resistance values are different from each other in a case of using the time constant $\tau 1'$ and the time constant $\tau 2'$. Therefore, it is not possible to determine the time constant $\tau 1'$ and the time constant $\tau 2'$ independently. In accordance with the first embodiment, the first time constant $\tau 1$ is defined with the first capacitance value and the first resistance value, and the second time constant $\tau 2$ is determined with the second capacitance value and the second resistance value. It is possible to reduce the first time constant $\tau 1$ and enlarge the second time constant $\tau 2$ further.

Figure 8A:
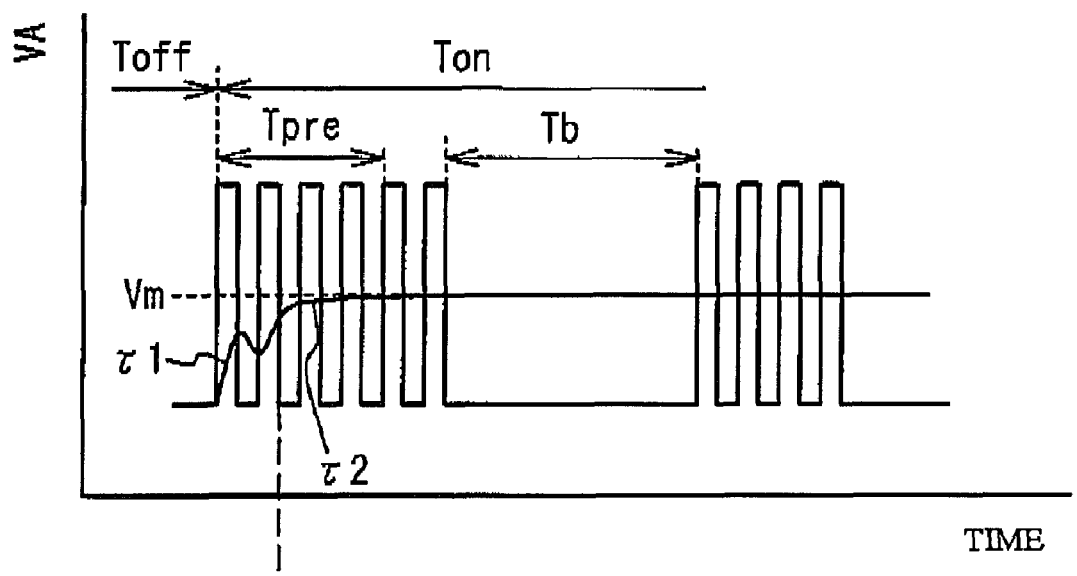
FIG. 8A and FIG. 8B illustrate a timing chart of the electronic circuit in accordance with the first embodiment.
Figure 8B:
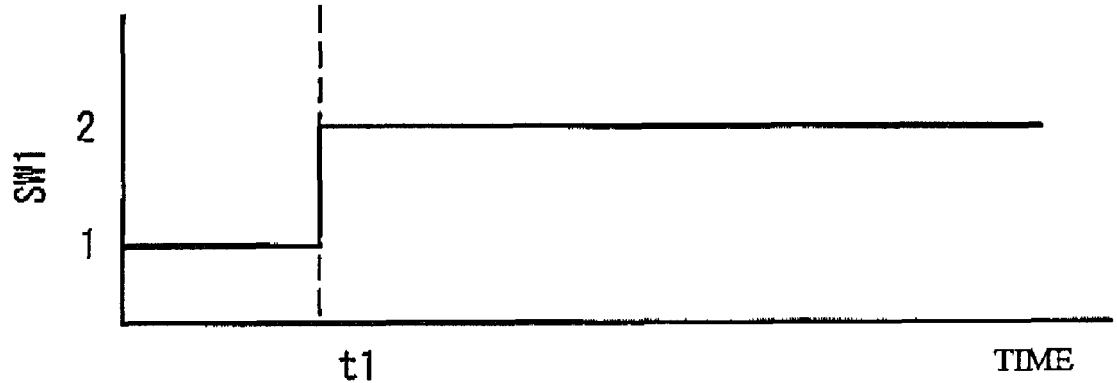

FIG. 8A illustrates the input signal VA and the reference signal Vref with respect to time of the electronic circuit 106 in accordance with the first embodiment. FIG. 8B illustrates the first switch signal SW1 for switching the first switch S1. At the beginning of the preamble period Tpre, the first switch signal SW1 is "1" and the first switch S1 selects the first output signal Vref1 of the first smoothing circuit 21. Therefore, the reference signal Vref is the input signal VA smoothed with use of the time constant $\tau 1$ smaller than the time constant $\tau 1'$ of the first comparative embodiment. Thus, the reference signal Vref gets closer to the average Vm earlier than the second comparative embodiment. The first switch S1 switches the reference signal Vref from the first output signal Vref1 of the first smoothing circuit 21 to the second output signal Vref2 of the second smoothing circuit 22 at the time t1 after the differential amplifier circuit 14 receives the input signal VA. That is, the first switch signal SW1 is "2" at the time t1, and the first switch S1 selects the second output signal Vref2 of the second smoothing circuit 22. Therefore, the reference signal Vref is the input signal VA smoothed with use of the time constant $\tau 2$ larger than the time constant $\tau 2'$ of the second comparative embodiment. It is therefore possible to stabilize the reference signal Vref more than the second comparative embodiment, even if the low level of the input signal VA continues as is the case of the period Tb.

As mentioned above, the difference between the first time constant $\tau 1$ and the second time constant $\tau 2$ is enlarged in accordance with the first embodiment. Therefore, the reference signal Vref is stabilized promptly. And the reference signal Vref is stabilized even if the high level or the low level of the input signal VA continues.

The first smoothing circuit 21 smoothes the input signal VA according to the first capacitance value and the first resistance value with use of the first time constant $\tau 1$, and the second smoothing circuit 22 smoothes the input signal VA according to the second capacitance value and the second resistance value with use of the second time constant $\tau 2$, in the first embodiment.

Second Embodiment

Figure 9:
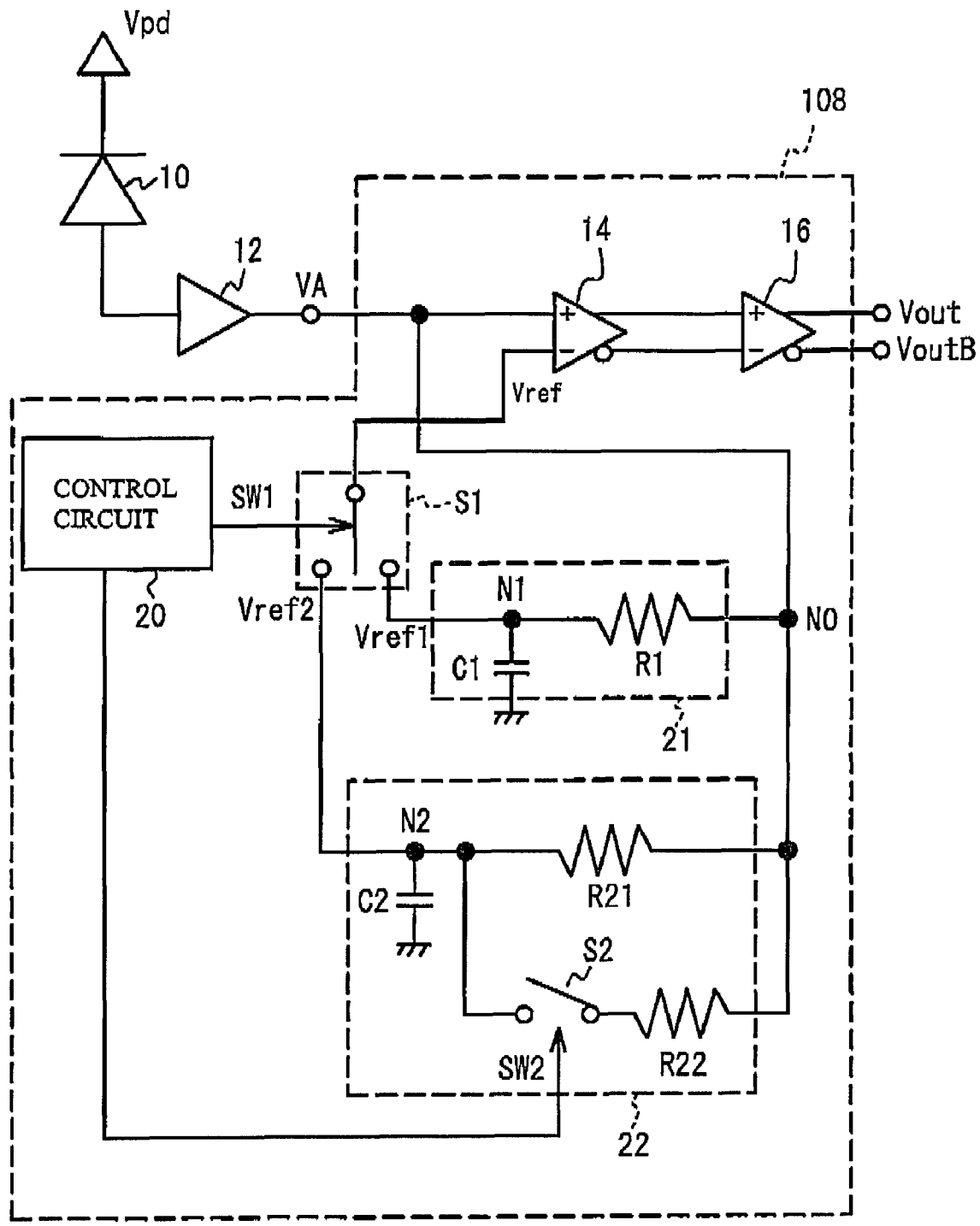
FIG. 9 illustrates a circuit diagram of an electronic circuit in accordance with a second embodiment.

FIG. 9 illustrates a block diagram of an electronic circuit 108 in accordance with a second embodiment. The second smoothing circuit 22 has a capacitor C2, resistors R21 and R22, and a second switch S2, being different from the first embodiment. The resistor R21 is connected between the input node N0 and the output node N2. The resistor R22 and the resistor R21 are connected between the input node N0 and the output node N2 in parallel. The capacitor C2 has a second capacitance value and is connected between the output node N2 and the ground. The second switch S2 connects the resistor R22 to the output node N2 or shut out the resistor R22 from the node N2. The control circuit 20 controls the second switch S2 with use of the second switch signal SW2. The other structure is the same as the structure of the first embodiment shown in FIG. 7.

In the first embodiment, the capacitor C2 is charged via the resistor R2. Therefore, there may be a case where the capacitor C2 is not charged sufficiently when the first switch S1 selects the second smoothing circuit 22. In this case, the reference signal is not stabilized. It is preferable that the electrical potential of the output node N1 is approximately the same as that of the output node N2, in order that the reference signal Vref switches the first switch S1 stably. Therefore, it is not possible to switch the first switch S1 until the capacitor C2 is charged.

In accordance with the second embodiment, a resistance value is reduced between the input node N0 and the output node N2 during the charging of the capacitor C2, when the switch S2 is being on. In particular, it is possible to charge the capacitor C2 promptly by reducing the resistance value of the resistor R22 to less than the resistance value of the resistor R21. After that, the resistance value is enlarged between the input node N0 and the output node N2 when the second switch S2 turns off. It is therefore possible to enlarge the second time constant $\tau 2$ of the second smoothing circuit 22. In accordance with the second embodiment, it is possible to switch the first switch S1 from the first smoothing circuit 21 to the second smoothing circuit 22.

The second switch S2 has only to select one of the first resistance value and the second resistance value larger than the first resistance value and to be connected to the capacitor C2. In the second embodiment, the resistance value in a case where the resistor R21 and the resistor R22 are connected in parallel corresponds to the first resistance value. The resistance value of the resistor R21 corresponds to the second resistance value. The second switch S2 is a switch for switching from the first resistor to the second resistor.

Figure 10A:
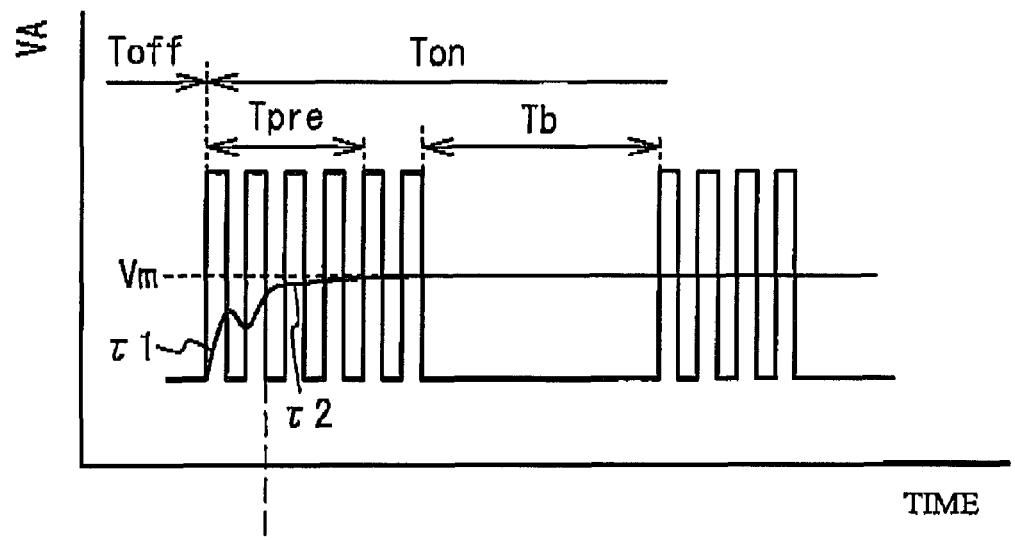
FIG. 10A through FIG. 10C illustrate a timing chart of the electronic circuit in accordance with the second embodiment.
Figure 10B:
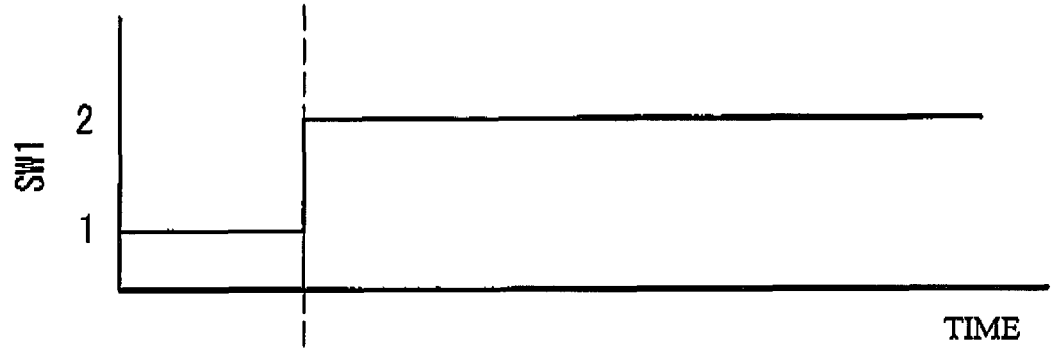
Figure 10C:

FIG. 10A illustrates the input signal VA and the reference signal Vref with respect to time of the electronic circuit 108 in accordance with the second embodiment. FIG. 10B illustrates the first switch signal SW1 for switching the first switch S1. FIG. 10C illustrates the second switch signal SW2 for switching the second switch S2. It is preferable that the second switch S2 turns off when the electrical potential of the input node N0 is approximately the same as that of the output node N2. In the second embodiment, the control circuit 20 outputs the first switch signal SW1 and the second switch signal SW2 at a time, the first switch signal SW1 being used when the first switch S1 switches from the output of the first smoothing circuit 21 to the output of the second smoothing circuit 22, the second switch signal SW2 for turning the second switch S2 off. It is not necessary to switch the first switch S1 and the second switch S2 at a time. However, the control circuit 20 is simplified if the first switch S1 and the second switch S2 are switched at a time.

Third Embodiment

Figure 11:
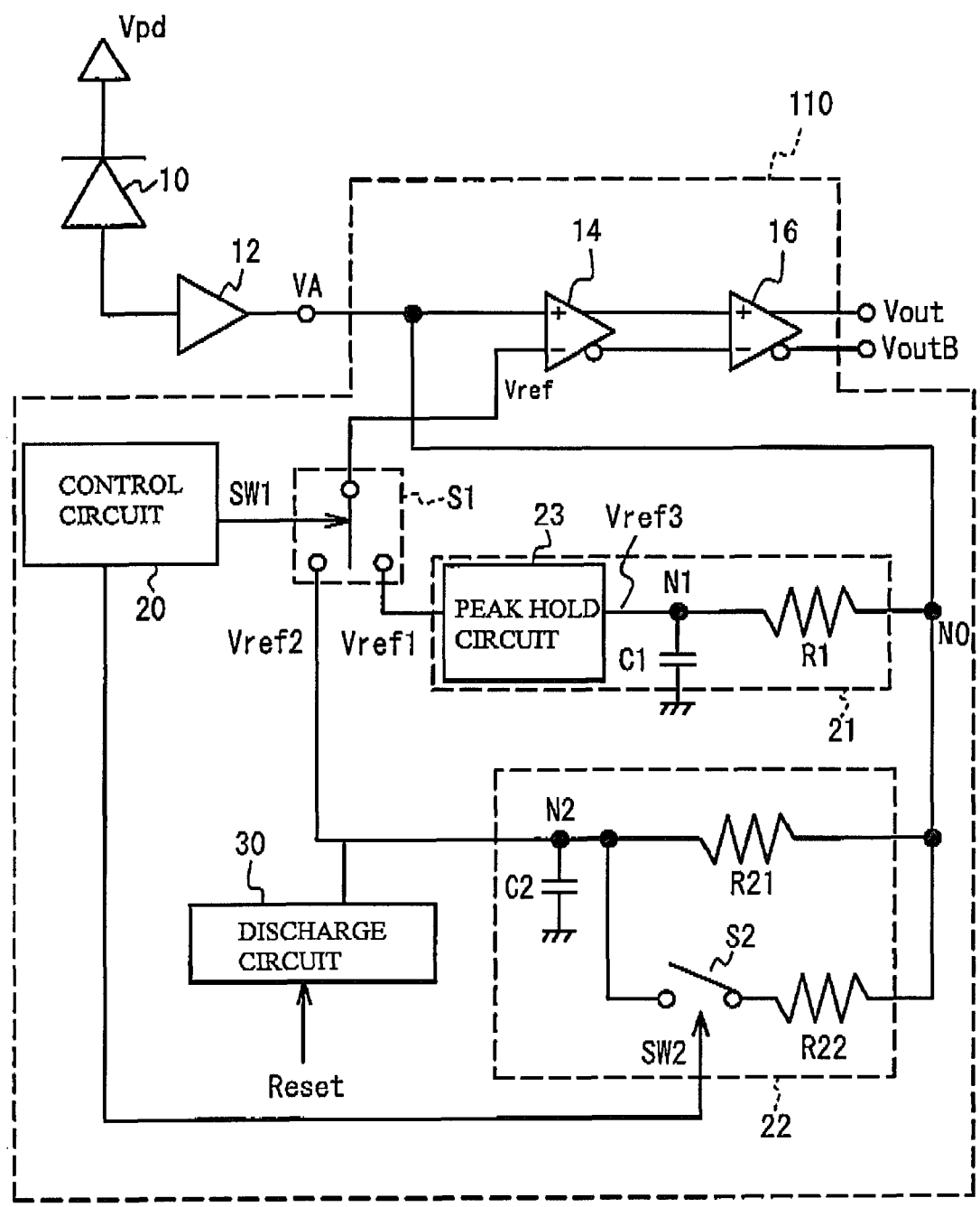
FIG. 11 illustrates a circuit diagram of an electronic circuit in accordance with a third embodiment.

FIG. 11 illustrates a block diagram of an electronic circuit 110 in accordance with a third embodiment. The first smoothing circuit 21 has a peak hold circuit 23 (a holding circuit) between the node N1 and the first switch S1, being different from the second embodiment shown in FIG. 9. The peak hold circuit 23 outputs a signal held according to a signal Vref3 smoothed with the first time constant t1 as the first output signal Vref1 of the first smoothing circuit 21. For example, the peak hold circuit 23 holds and outputs the peak of the signal Vref3 of the node N1. A discharge circuit 30 is connected to the output node N2 of the second smoothing circuit 22. The discharge circuit 30 (a reset circuit) discharges the output node N2. It is therefore possible to control the reference signal Vref to be constant. The other structure is the same as that of the second embodiment shown in FIG. 9.

Figure 12:
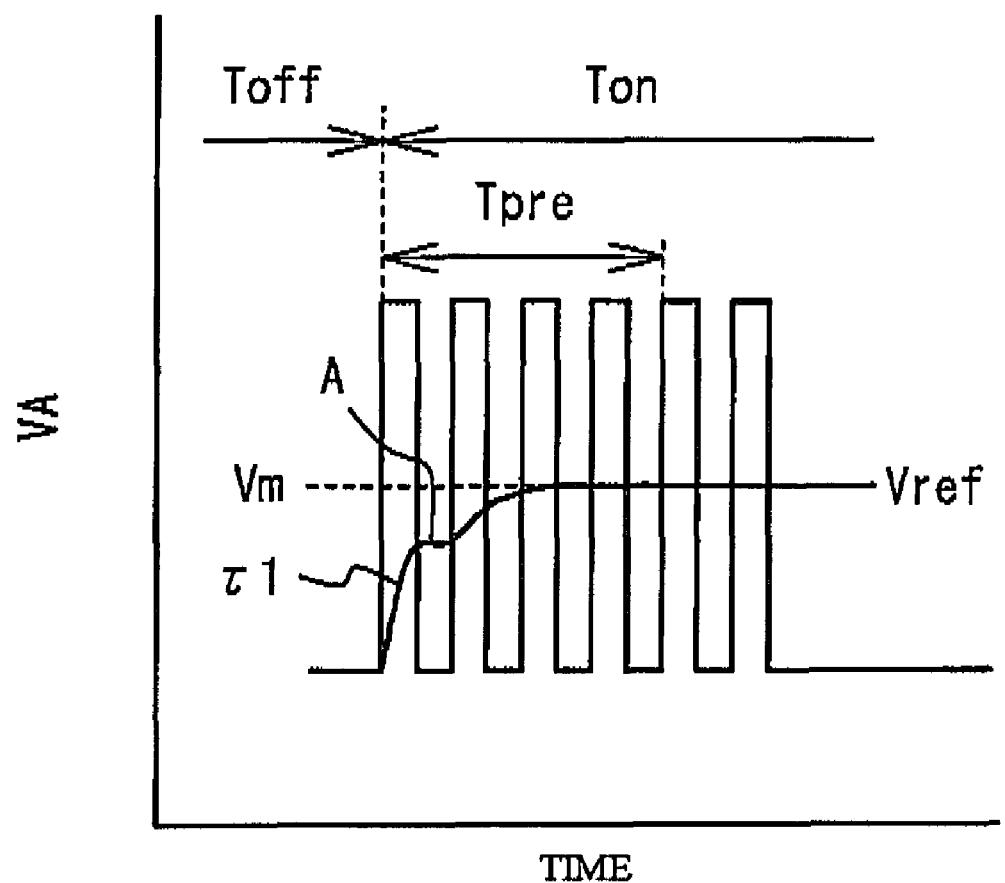
FIG. 12 illustrates a timing chart of the electronic circuit in accordance with the third embodiment.

A description will be given of an effect in a case where the peak hold circuit 23 is provided. FIG. 12 illustrates the input signal VA and the reference signal Vref of the electronic circuit 110 in accordance with the third embodiment. As shown in FIG. 12, the reference signal Vref is stabilized promptly with use of the first time constant $\tau 1$ according to the input signal VA. The peak hold circuit 23 holds the peak of the reference signal Vref even if the input signal VA is low level. Therefore, the reference signal Vref is not lowered even if the input signal VA is low level as shown in A of FIG. 12. It is therefore possible to change the reference signal Vref to the average Vm of the input signal VA promptly and switch from the first time constant $\tau 1$ to the second time constant $\tau 2$ promptly, compared to the second embodiment.

Although, in the third embodiment, the peak hold circuit 23 holds the local maximum of the signal Vref3 of the node N1 and outputs the local maximum value to the first switch S1, the peak hold circuit 23 may hold a value near the local maximum value and output the value to the first switch S1.

Figure 13A:
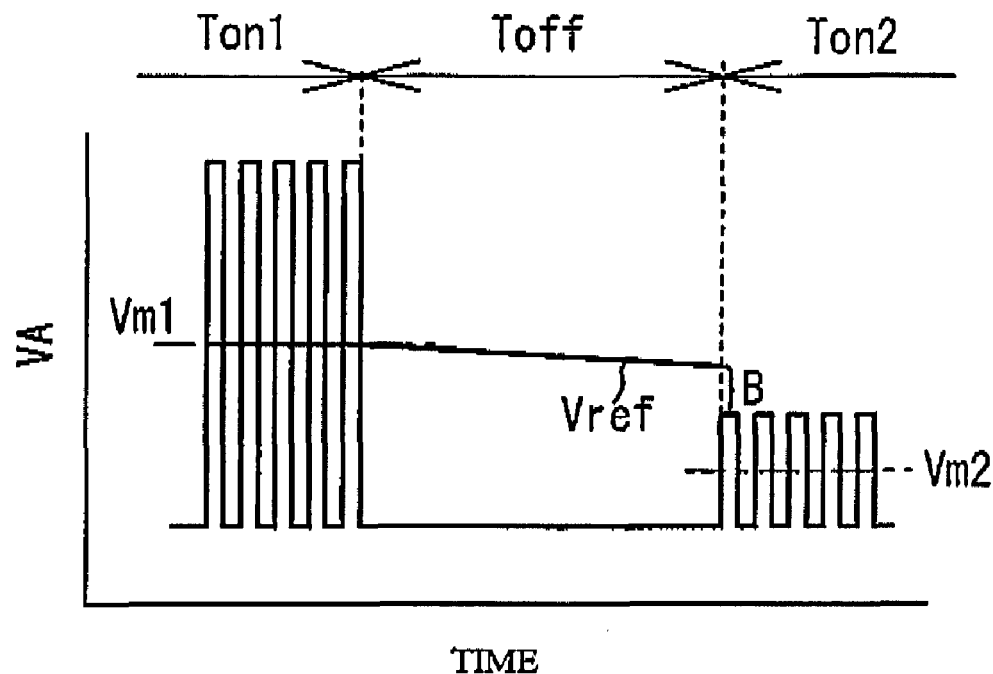
FIG. 13A and FIG. 13B illustrate a timing chart of a case where the electronic circuit is not reset in the third embodiment.
Figure 13B:
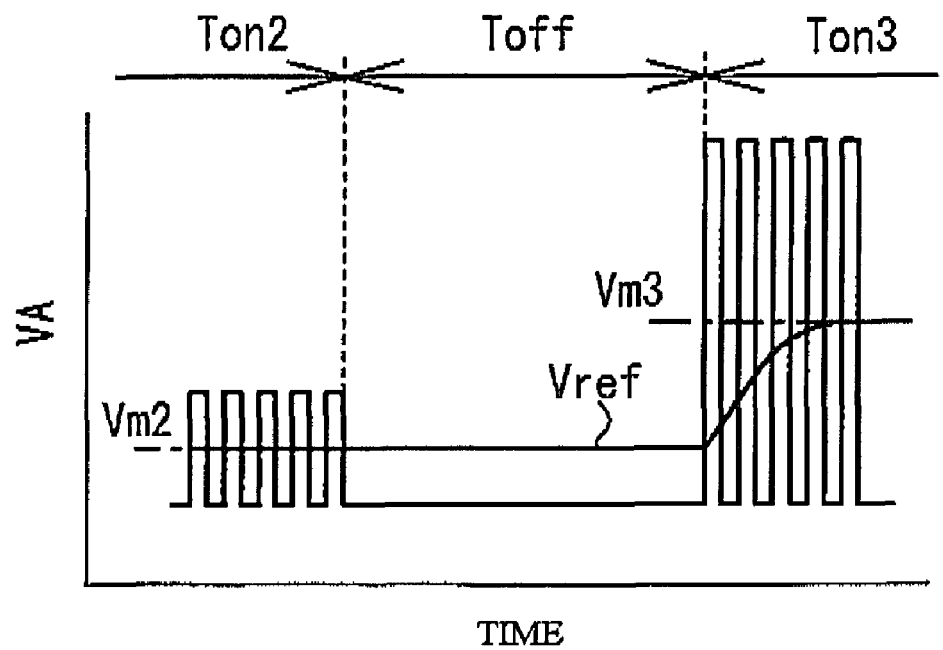

Next, a description will be given of a function and an effect of the discharge circuit 30. FIG. 13A and FIG. 13B illustrate a timing chart of the input signal VA and the reference signal Vref in a case where the discharge circuit 30 is not provided. FIG. 13A illustrates the period Ton1 where a signal having large amplitude is input, the period Toff where a signal is not input, and the period Ton2 where a signal having small amplitude is input. In a case where the discharge circuit 30 is not provided, the reference signal Vref is kept to be a value near the average Vm1 in the period Toff, because the second time constant $\tau 2$ is large. Therefore, the reference signal Vref may not correspond to the input signal VA as shown in B of FIG. 13A in a case where the signal having the small amplitude is input in the period Ton2.

FIG. 13B illustrates the period Ton2 where a signal having small amplitude is input, the period Toff where a signal is not input, and the period Ton3 where a signal having large amplitude is input. The reference signal Vref may correspond to the input signal VA because the input signal VA having big amplitude is input in the period Ton3, even if the reference signal Vref in the period Toff is kept to be the average Vm2 in the period Ton2.

As mentioned above, the reference signal Vref does not correspond to the input signal VA when a signal having small amplitude is input after the input signal VA having large amplitude, in a case where the discharge circuit 30 is not provided. And so, the reference signal Vref is initialized with use of the discharge circuit 30.

Figure 14A:
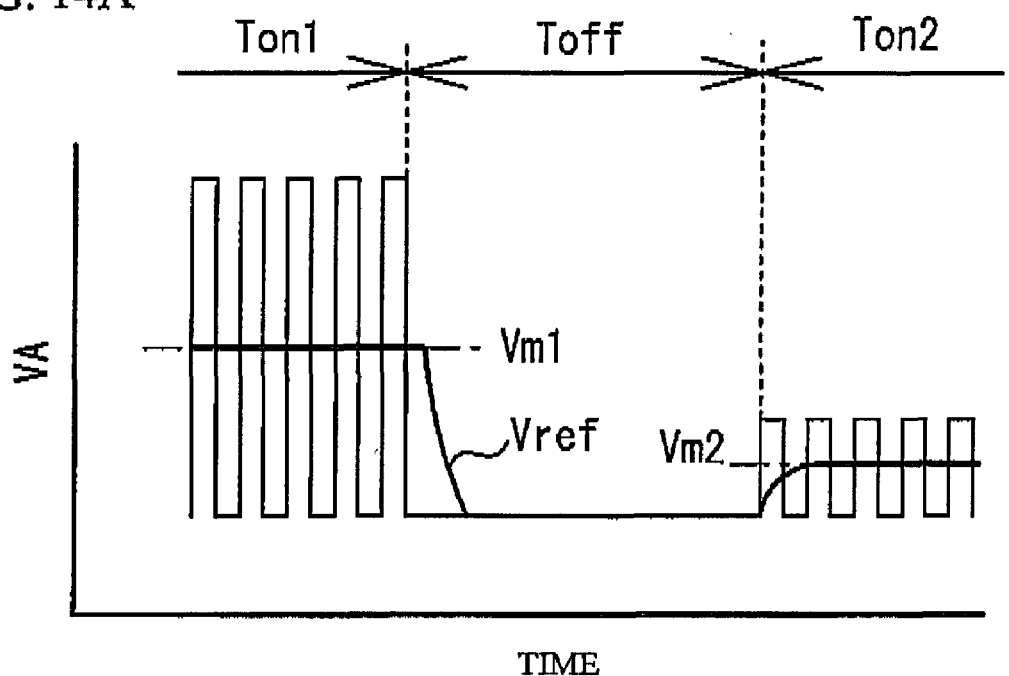
FIG. 14A and FIG. 14B illustrate a timing chart of a case where the electronic circuit is reset in the third embodiment.
Figure 14B:
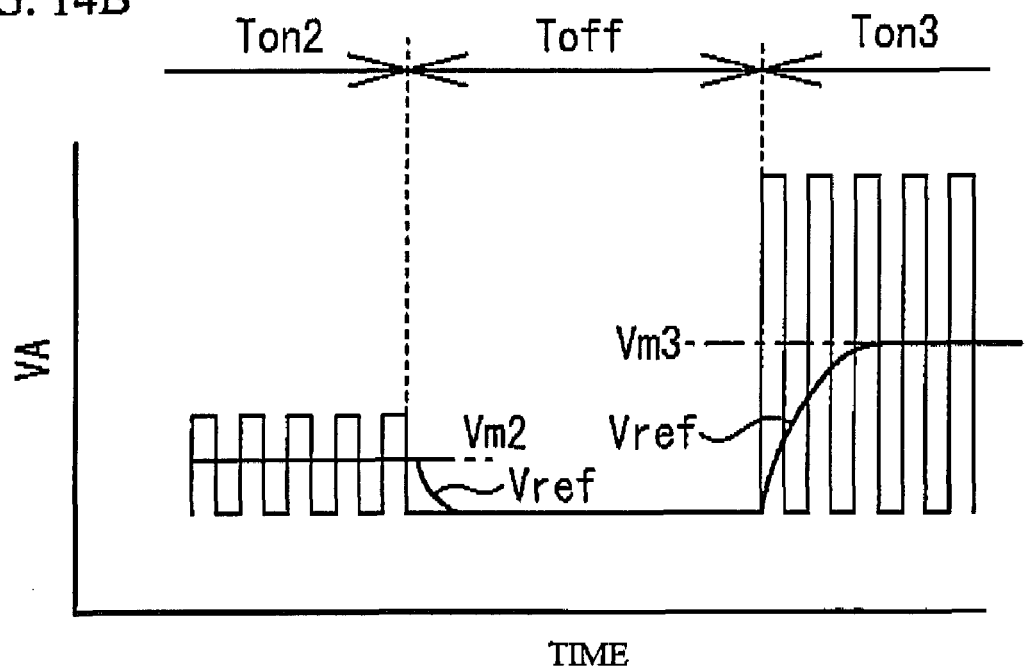

FIG. 14A and FIG. 14B illustrate a timing flow chart of the input signal VA and the reference signal Vref in a case where the reference signal Vref is reset with use of the discharge circuit 30. In the discharge circuit 30, the output node N2 is grounded and the reference signal Vref is initialized in the period Toff. Thus, the reference signal Vref may correspond to the input signal VA in a case where a signal having small amplitude is input in the period Ton2 after a signal having large amplitude is input in the period Ton1 as shown in FIG. 14A. For example, there is a case where a PON type limit amplifier has a signal detect function. The function is for alarming that the input signal is broken up when the input signal exceeds a given level or falls below a given level. It is preferable that the reference signal Vref is initialized in the period Toff, because a reference level is set independently of the amplitude of the input signal when the function is used. It is therefore preferable that the reference signal Vref is initialized when the input signal VA having large amplitude is input after the input signal VA having the small amplitude is input as shown in FIG. 14B.

It is preferable that the discharge circuit 30 sets the reference signal Vref to be constant. This results in resetting of the reference signal Vref as shown in FIG. 14A and FIG. 14B. Therefore, the reference signal Vref does not exceed the average Vm2 of the input signal VA in the period Ton2, as shown in FIG. 13A.

It is preferable that the constant value of the reference signal Vref is the initial value of the input signal VA. Here, the initial value is the reference signal Vref in a case where an initial direct voltage is input as the input signal VA. For example, the initial value corresponds to the reference signal Vref after infinite time with a voltage from the TIA12 being the input signal VA, when the PD 10 does not receive an optical signal, in FIG. 11. In the first embodiment, the initial value corresponds to low level of the input signal VA.

Fourth Embodiment

Figure 15:
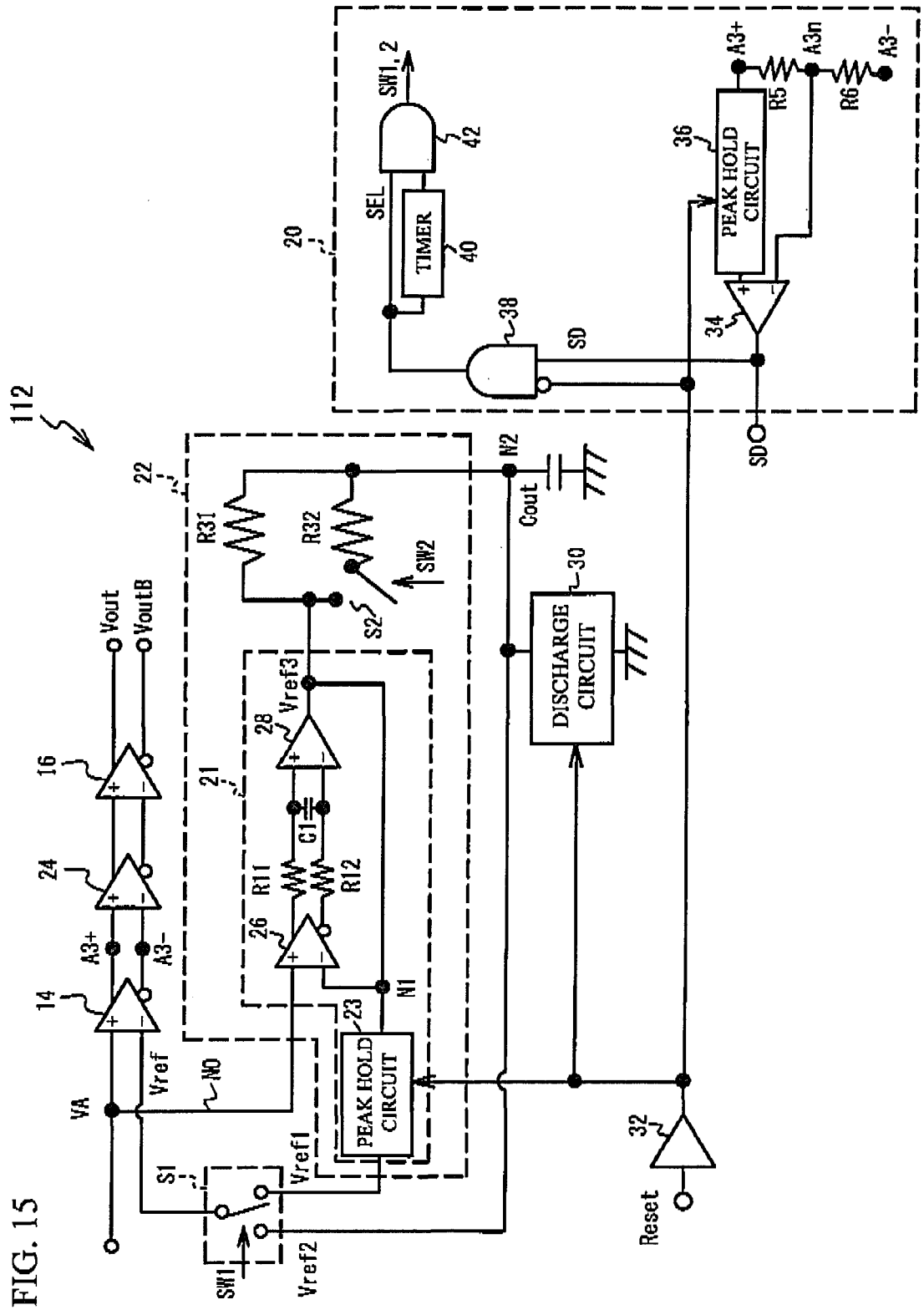
FIG. 15 illustrates a circuit diagram of an electronic circuit in accordance with a fourth embodiment.

FIG. 15 illustrates a block diagram of an electronic circuit 112 in accordance with a fourth embodiment. A differential amplifier circuit 24 is provided between the differential amplifier circuit 16 and the differential amplifier circuit 14, being different from the third embodiment.

The first smoothing circuit 21 has differential amplifier circuits 26 and 28, resistors R11 and R12, and a capacitor C1. The differential amplifier circuit 26 receives the input signal VA and the signal Vref3 of the output node N1 of the differential amplifier circuit 28. The differential amplifier circuit 26 differentially amplifies the input signal VA and the reference signal Vref3, and outputs the differentially amplified signal to the differential amplifier circuit 28 via the resistors R11 and R12. Two inputs of the differential amplifier circuit 28 are connected to each other via the capacitor C1. The differential amplifier circuit 28 differentially amplifies the output signal of the differential amplifier circuit 26 and outputs the signal Vref3 to the peak hold circuit 23. The peak hold circuit 23 outputs the first output signal Vref1 related to the signal Vref3. Therefore, the first smoothing circuit 21 smoothes the input signal VA with use of the first time constant related to the resistors R11 and R12 and the capacitor C1, and outputs the first output signal Vref1 held by the peak hold circuit 23.

The second smoothing circuit 22 has the first smoothing circuit 21, resistors R31 and R32, a second switch S2 and a capacitor Cout. The resistors R31 and the resistors R32 are connected in parallel between the node N1 of the first smoothing circuit 21 and the output node N2 of the second smoothing circuit 22. The second switch S2 is connected between the resistor R32 and the node N1. The output node N2 is grounded via the capacitor Cout. In the fourth embodiment, the second time constant τ2 is defined with the first time constant τ1, the resistor R31 and the capacitor Cout. The capacitor Cout may be charged promptly when the second switch S2 is turned on. On the other hand, the second time constant τ2 may be enlarged when the second switch S2 is turned off. A part of the second capacitance defining the second time constant τ2 may include the capacitance of the capacitor C1 of the first smoothing circuit 21. In other words, the capacitor Cout includes at least a part of the second capacitance value. The first smoothing circuit 21 may have the capacitor C1 acting as the first capacitance element and the second smoothing circuit 22 may have the capacitor C2 acting as the second capacitance element, as shown in the first through the third embodiments. The first smoothing circuit 21 may have the capacitor C1 acting as the first capacitance element and the second smoothing circuit 22 may have the capacitor C1 acting as the first capacitance element and the capacitor Cout acting as the second capacitance element. The function of the peak hold circuit 23, the first switch S1 and the discharge circuit 30 is the same as the third embodiment.

The control circuit 20 has resistors R5 and R6, a peak hold circuit 36, a hysteresis comparator 34, AND circuits 38 and 42 and a timer 40. The resistors R5 and R6 are connected between an output signal A3+ and an output signal A3− of the differential amplifier circuit 14. The peak hold circuit 36 keeps the peak of the signal A3+ and outputs the signal A3+ to the hysteresis comparator 34. A signal resistively divided by the resistors R5 and R6 is fed into another input of the hysteresis comparator 34. The hysteresis comparator 34 outputs a high level as a signal SD when the signal A3+ is more than a given rate of a local maximum of the signal A3+. The AND circuit 38 outputs a high level as a signal SEL when a rest signal Reset is low level (not reset) and the signal SD is high level. The AND circuit 42 receives the signal SEL and the signal SEL delayed in the timer 40. The AND circuit 42 outputs a high level as the first switch signal SW1 and the second switch signal SW2, when a given time passes after the signal SEL is changed to high level. The switch S1 selects the output signal Vref1 of the first smoothing circuit 21 when the first switch signal SW1 is low level, and selects a second outputs signal Vref2 of the second smoothing circuit 22 when the first switch signal SW1 is high level. The second switch S2 is turned off when the second switch signal SW2 is high level and is turned on when the second switch signal SW2 is low level.

An amplifier circuit 32 receives the reset signal Reset. The reset signal Reset is a signal for resetting a corresponding circuit when the reset signal Reset is high level. An output from the amplifier circuit 32 is fed into the peak hold circuits 23 and 36. The peak hold circuits 23 and 36 are reset when the reset signal Reset is high level. Thus, the local maximum values respectively held by the peak hold circuits 23 and 36 are reset. The output of the amplifier circuit 32 is fed into the discharge circuit 30. The discharge circuit 30 grounds the output node N2 when the reset signal Reset is high level. Therefore, the charge of the capacitor Cout is released.

Figure 16:
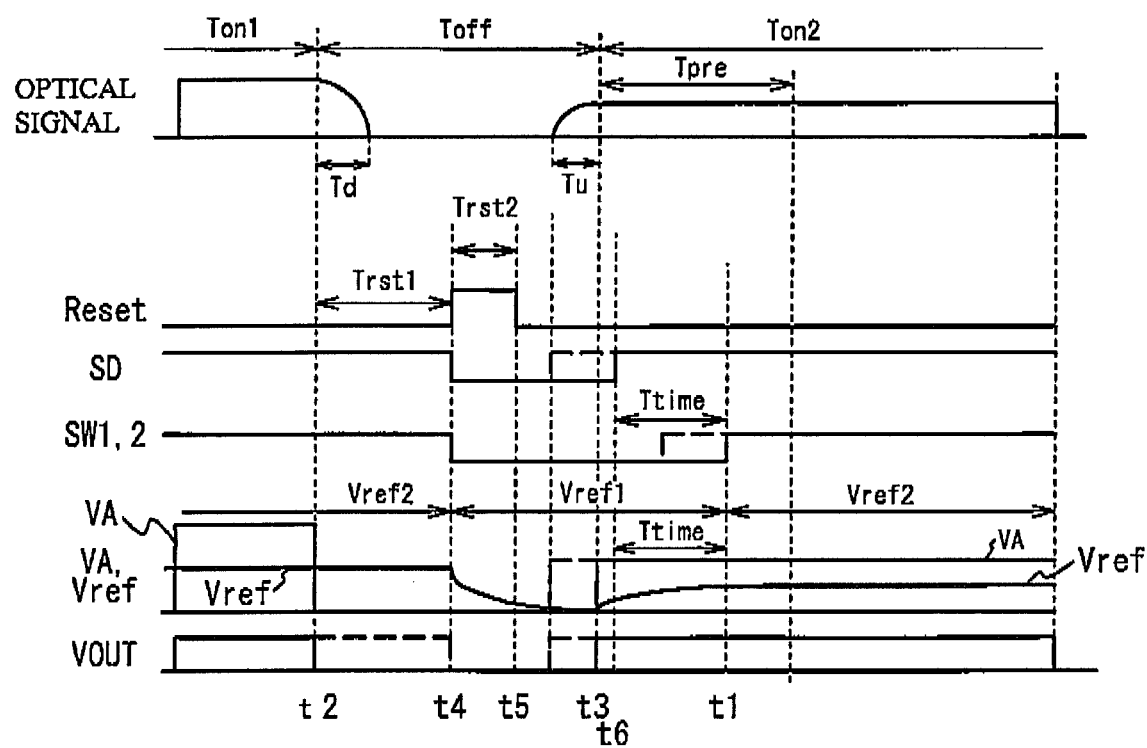
FIG. 16 illustrates a timing chart of an electronic circuit in accordance with the fourth embodiment.

FIG. 16 illustrates a timing chart of the electronic circuit 112 in accordance with the fourth embodiment. The period Ton1 and the period Ton2 are a period in which an optical signal is fed into the PD. In the period Ton1, the input signal VA has large amplitude. In the period Ton2, the input signal VA has small amplitude. A period is changed from the period Ton1 to the period Toff at the time t2. A period is changed from the period Toff to the period Ton2 at the time t3. An initial period Td at which the period is changed from the period Ton1 to the period Toff is a falling period of an optical signal, and is for example 12.8 ns. A period Tu just before the period is changed from the Toff to the period Ton2 is a start-up period, and is for example 12.8 ns. A preamble period Tpre is provided at a beginning of the period Ton2.

In the period Ton1, the reset signal Reset is low level, and the signal SD is high level. Therefore, the AND circuit 38 outputs a high level, and the AND circuit 42 outputs a high level. That is, the first switch signal SW1 and the second switch signal SW2 are high level. Therefore, the first switch S1 selects the second output signal Vref2 as the reference signal Vref. The second switch S2 is off. The reference signal Vref is approximately an average of the input signal VA. The output signal Vout is output as a high level or a low level according to a comparative result of the input signal VA and the reference signal Vref.

A period Trst1 is a period from the time t2 to the time t4 when the reset signal Reset is changed, and is between 12.8 ns and 17.6 ns. In the period Trst1, the output signal Vout is uncertain. That is, the output signal Vout is high level or low level. The signal SD is low level and the first switch signal SW1 and the second switch signal SW2 are low level when the reset signal Reset is high level, at the time t4. Thus, the peak hold circuits 23 and 36 are reset. The discharge circuit 30 grounds the output node N2. The first switch S1 selects the first output signal Vref, and the second switch S2 is turned on. Thus, the reference signal Vref is reset. The period Trst2 where the reset signal Reset is high level is, for example, less than 8 ns.

The signal SD, the first switch signal SW1 and the second switch signal SW2 are kept to be low level, even if the reset signal Reset is changed to low level at the time t5. The output of the peak hold circuit 36 is kept to be the initial value (for example zero V), because the peak hold circuit 36 is reset at the t4. In this case, the hysteresis comparator 34 outputs a low level. Therefore, the signal SD, the first switch signal SW1 and the second switch signal SW2 are low level.

The signal A3+ is changed to plus and the peak hold circuit 36 outputs the maximum of the signal A3+, when the input signal VA is more than the reference signal Vref. The signal A3n is lower than the signal A3+. Therefore, the hysteresis comparator 34 outputs a high level as the signal SD. However, the first switch signal SW1 and the second switch signal SW2 are kept to be low level, in the holding time Ttime of the timer 40. The reference signal Vref is stabilized with a short time constant, because the first switch S1 selects the first output signal Vref as the reference signal Vref in the holding time Ttime. And, the second switch S2 is on, and the capacitor Cout is charged through the resistors R31 and R32. It is therefore possible to charge the capacitor Cout with a short time constant.

The AND circuit 42 outputs a high level when the holding tine Ttime passes at the time t1. Therefore, the first switch signal SW1 and the second switch signal SW2 are changed to high level. Therefore, the first switch S1 selects the second output signal Vref2 as the reference signal Vref. And the second witch S2 is turned off. Therefore, the reference signal Vref is stabilized with a long time constant.

The time t6 and the time t1 are shifted according to the amplitude of the input signal VA. Therefore, a switching timing of the signal SD, the first switch signal SW1 and the second switch signal SW2 is shifted as a dashed line in FIG. 16. Therefore, the first switch signal SW1 and the second switch signal SW2 may be switched after the preamble period Tpre is finished. In accordance with the fourth embodiment, it is accessible when a communication is on after the preamble period Tpre because the reference signal Vref is stabilized promptly with the first output signal Vref1, even if the preamble period Tpre is finished before the switching of the first switch signal SW1 and the second switch signal SW2.

FIG. 17A through FIG. 17C illustrate a simulation result of the electronic circuit 112 in accordance with the fourth embodiment. The capacitance value of the capacitor Cout is 1 nF, the resistance values of the resistors R31 and R32 are 5Ω and 1.6 kΩ respectively, in the simulation. The time constant of the first output signal Vref1 is 2 ns. FIG. 17A illustrates the input signal VA and the reference signal Vref with respect to time. FIG. 17B illustrates the reset signal Reset, the signal SD, the first switch signal SW1 and the second switch signal SW2. FIG. 17C illustrates the output signal Vout and the output signal VoutB. The amplitude of the input signal VA is large in the period Ton1 and small in the period Ton2. The reset signal Reset and the signal SD are low level and the first switch signal SW1 and the second signal SW2 are high level, before the input signal VA is input. The reference signal Vref is the first output signal Vref1 that is the input signal VA smoothed with a short time constant, and the reference signal Vref is changed to approximately an average value of the input signal VA promptly.

The first switch signal SW1 and the second switch signal SW2 are turned to low level at the time t1 after the holding time Ttime, after the signal SD is turned to high level at the time t6. Therefore, the reference signal Vref is the second output signal Vref2 that is the input signal VA smoothed with a long time constant. Therefore, the reference signal Vref is not reduced instantly in the period Toff after the time t2. The signal SD is turned to low level and the first switch signal SW1 and the second switch signal SW2 are turned to high level, when the reset signal Reset is turned to high level at the time t4. Therefore, the reference signal Vref is the first output signal Vref1 that is the input signal VA smoothed with a short time constant, and the reference signal Vref is changed to approximately an average value of the input signal VA promptly, when the input signal VA is input at the time t3. The reference signal Vref is switched to the second output signal Vref2 of the second smoothing circuit 22 when the holding time Ttime passes after the signal SD is turned to high level, although that is not illustrated.

It is possible to stabilize the reference signal Vref promptly because the a differential between the time constants of the first smoothing circuit 21 and the second smoothing circuit 22 may be enlarged, in accordance with the fourth embodiment. And it is possible to stabilize the reference signal Vref.

Fifth Embodiment

Figure 18:
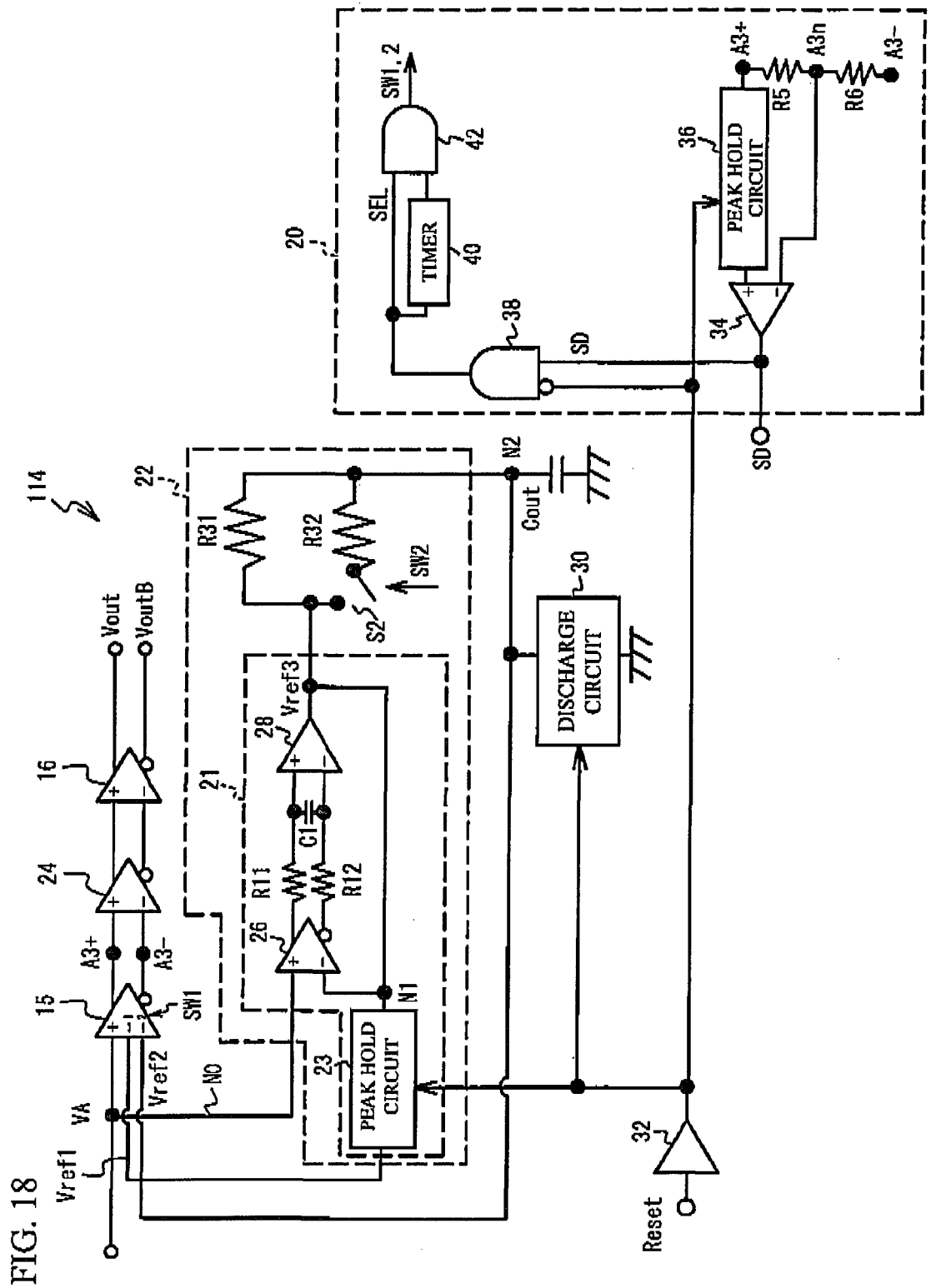
FIG. 18 illustrates a circuit diagram of an electronic circuit in accordance with a fifth embodiment.

FIG. 18 illustrates a block diagram of an electronic circuit 114 in accordance with a fifth embodiment. In the fifth embodiment, a differential amplifier circuit 15 receives the first output signal Vref1 and the second output signal Vref2. The differential amplifier circuit 15 acts as the first switch S1 selecting the first output signal Vref1 and the second output signal Vref2. The other structure is the same as that of the first embodiment.

The first embodiment through the fifth embodiment disclose a case where an output signal of TIA12 as the input signal VA. However, the input signal VA may be other than the output signal of the TIA. It is preferable that the electronic circuit of the first embodiment through the fifth embodiment is used, because signals having different amplitude are fed into an amplifier circuit for a PON type optical communication.

The present invention is not limited to the specifically disclosed embodiments, but include other embodiments and variations without departing from the scope of the present invention.

The present application is based on Japanese Patent Application No. 2007-177176 filed on Jul. 5, 2007, the entire disclosure of which is hereby incorporated by reference.

What is claimed is:

1. An electronic circuit comprising:
   a differential amplifier circuit receiving a digital input signal and a reference signal;
   a first smoothing circuit that smoothes the digital input signal with a first capacitance value and includes a first capacitance element, the first capacitance value being constituted by the first capacitance element;
   a second smoothing circuit that smoothes the digital input signal with a second capacitance value larger than the first capacitance value and includes a second capacitance element, the second capacitance value being constituted by sum value of the first capacitance element and the second capacitance element; and
   a first switch that selects one of output signals from the first smoothing circuit and the second smoothing circuit as the reference signal.

2. The electronic circuit as claimed in claim 1, wherein output of the first smoothing circuit is fed into the first switch and the second smoothing circuit.

3. The electronic circuit as claimed in claim 1, wherein the first switch switches the reference signal from the output signal of the first smoothing circuit to the output signal of the second smoothing circuit before end of a preamble period of the digital input signal.

4. The electronic circuit as claimed in claim 1, wherein the input signal is an output signal from a trans-impedance amplifier.

5. An electronic circuit comprising:
   a differential amplifier circuit receiving a digital input signal and a reference signal;
   a first smoothing circuit that smoothes the digital input signal with a first capacitance value;
   a second smoothing circuit that smoothes the digital input signal with a second capacitance value larger than the first capacitance value; and a first switch that selects one of output signals from the first smoothing circuit and the second smoothing circuit as the reference signal, wherein the second smoothing circuit has a capacitor, a second switch, a first resistor and a second resistor, the capacitor connecting the first resistor and the second resistor and having at least a part of the second capacitance value, the second switch selecting one of a first resistance value and a second resistance value larger than the first resistance value by switching the connection of the first resistor and the second resistor.

6. The electronic circuit as claimed in claim 5, wherein each of the first switch and the second switch switches at the same time.

7. The electronic circuit as claimed in claim 5, wherein the input signal is an output signal from a trans-impedance amplifier.

8. An electronic circuit comprising:
a differential amplifier circuit receiving a digital input signal and a reference signal;
a first smoothing circuit that smoothes the digital input signal with a first capacitance value;
a second smoothing circuit that smoothes the digital input signal with a second capacitance value larger than the first capacitance value; and
a first switch that selects one of output signals from the first smoothing circuit and the second smoothing circuit as the reference signal,
wherein:
the first smoothing circuit has a peak hold circuit that holds a smoothed signal, and
the second smoothing circuit has a discharge circuit, each of the peak hold circuit and the discharge circuit having a reset terminal.

9. The electronic circuit as claimed in claim 8, wherein:
the first smoothing circuit includes a first capacitance element, the first capacitance value being constituted by the first capacitance element; and
the second smoothing circuit includes a second capacitance element, the second capacitance value being constituted by the first capacitance element.

10. The electronic circuit as claimed in claim 8, wherein the input signal is an output signal from a trans-impedance amplifier.

* * * * *